United States Patent

Tuckerman et al.

Patent Number: 5,397,997
Date of Patent: Mar. 14, 1995

[54] BURN-IN TECHNOLOGIES FOR UNPACKAGED INTEGRATED CIRCUITS

[75] Inventors: David Tuckerman, Dublin; Pradip Patel, Redwood City, both of Calif.

[73] Assignee: nCHIP, Inc., San Jose, Calif.

[21] Appl. No.: 57,590

[22] Filed: May 6, 1993

Related U.S. Application Data

[63] Continuation of Ser. No. 749,246, Aug. 23, 1991, abandoned.

[51] Int. Cl.$^6$ ............................................. G01R 31/02
[52] U.S. Cl. .................................. 324/754; 324/758
[58] Field of Search ............... 324/158 F, 158 P, 72.5, 324/754; 439/67; 228/123, 129

[56] References Cited

U.S. PATENT DOCUMENTS

| | | | |
|---|---|---|---|
| 4,281,449 | 8/1981 | Ports et al. | 29/543 |
| 4,453,795 | 6/1984 | Moulin | 439/67 |
| 4,503,335 | 3/1985 | Takahashi | 324/158 F |
| 4,717,066 | 1/1988 | Goldenberg et al. | 228/179 |
| 4,749,120 | 6/1988 | Hatada | 228/123 |
| 4,820,976 | 4/1989 | Brown | 324/158 P |
| 4,839,587 | 6/1989 | Flatley et al. | 324/158 F |
| 4,859,189 | 8/1989 | Petersen et al. | 439/66 |
| 4,899,099 | 2/1990 | Menderhall et al. | 324/158 F |
| 4,899,107 | 2/1990 | Corbett et al. | 324/158 F |
| 4,926,117 | 5/1990 | Nevill | 324/158 F |
| 4,956,605 | 9/1990 | Bickford et al. | 324/158 F |
| 4,967,146 | 10/1990 | Morgan et al. | 324/158 R |
| 4,968,931 | 11/1990 | Littlebury et al. | 324/158 R |
| 5,012,187 | 4/1991 | Littlebury | 324/158 F |

OTHER PUBLICATIONS

Levine, Bernard "Multichip Modules Join Arsenal" Electronic News, 38:1917; Jun. 22, 1992.
"Reusable Chip Test Package," Bry et al, IBM Technical Discl. Bulletin, vol. 22,#4 Sep. 1979.
"Wafer Burn-In" Reinhart et al, IBM Technical Discl. Bulletin vol. 26 #10A Mar. 1984.

Primary Examiner—Vinh Nguyen
Attorney, Agent, or Firm—Townsend and Townsend Khourie and Crew

[57] ABSTRACT

A device and method for burn-in of bare chips prior to assembly into a multichip module. Each die to be tested is positioned with its I/O pads positioned to face an interconnection burn-in test substrate which may be a silicon circuit board. Each die is temporarily electrically connected to the substrate by a deformable solder bump.

24 Claims, 8 Drawing Sheets

BURN-IN TECHNOLOGIES FOR UNPACKAGED INTEGRATED CIRCUITS

The invention herein described was developed in part in the course of or under contract with the U.S. Air Force, Contract No. F33615-90-C-1481. Accordingly, the government may have certain limited rights in the invention disclosed herein.

This is a continuation of application Ser. No. 07/749,246, filed Aug. 23, 1991, now abandoned.

BACKGROUND OF THE INVENTION

The present invention relates to burn-in technology for integrated circuits and in particular to burn-in technologies for unpackaged integrated circuits for use in Multichip Modules.

A certain percentage of the integrated circuits (ICs) formed in a manufacturing process fail in the first hours or days of use. The infant mortality of the ICs results from latent defects in the device as manufactured. Semiconductor circuits having a relatively large die size and relatively thin gate oxides are particularly susceptible to infant mortality.

The bulk of early failures may be detected by applying power and then supplying a series of test signals to the circuit thereby extensively exercising the circuits at high temperature. Devices which do not respond properly to the test signals or otherwise fail can then be discarded before shipment. This test procedure is called burn-in.

In a typical burn-in process, a large number of packaged ICs are individually mounted on printed circuit boards having a circuit design that permits the ICs to be exercised in parallel. The printed circuit board loaded with ICs is then placed in a burn-in oven. The burn-in oven controls the ambient temperature during the test process. Generally, ICs are burned in for 72 hours or more at temperatures exceeding 100° C.

The burn-in process imposes many significant cost penalties on chip manufacturers. For example, the physical space required to mount individual packaged chips on a few printed circuit boards can consume several cubic feet. The facility space necessary to burn-in a significant number of test assemblies of this size can therefore easily occupy a city block. Furthermore, the power required to heat the burn-in oven and power the ICs is considerable. Assembly of the ICs into sockets onto printed circuit boards is also labor intensive and may damage ICs which might otherwise survive the burn-in process.

In addition to cost penalties, the conventional burn-in process is performance limited. The long lead lines of printed circuit boards and other conventional packaging can create electrical noise and limit the overall operating speed of the circuit to approximately 40 MHz. So long as the ICs being tested do not operate faster than the performance of the test circuit board or, alternately if the IC is ultimately to be packaged on a board having similar performance characteristics, the performance limitations of the burn-in test package are of minimal concern.

Modern ICs, however, are capable of operating in excess of 40 MHz. Therefore, multichip modules (MCMs) are emerging as the packaging and interconnection medium of choice for high performance and on high density electronics systems, both commercial and military. FIG. 1 is a cross-sectional view of one type of MCM. The MCM contains a high denity interconnect substrate (HDI) base 40 over which is located a conducting plane formed of power and ground planes 42 and 44. Power and ground planes 42 and 44 are in turn separated from each other by insulating layer 48. Contact to the power and ground planes may be directly made using vias (not shown). Positioned above the power and ground planes is a second dielectric layer 70 which insulates the power and ground planes 42 and 44 from metal interconnect layers 76 and 77. A plurality of ICs 90 attach to the surface of the HDI to form the MCM. ICs 90 contact interconnect layers 76 and 77 through vias 79. The surface of the typical MCM may contain a passivation layer 86. There are a variety of technologies which may be used to implement each of these elements and as stated above, the structure of FIG. 1 is but one example of an MCM structure. A system assembled using MCMs permits system operation at the faster operating speeds of modern ICs in addition to providing cost, size, weight, and reliability advantages over conventional packaging.

Two generic problems of great concern to current and prospective manufacturers of MCMs are test-at-speed and burn-in of the chips. If chips cannot be verified as functional under the desired operating speeds, assembling the chips into an MCM may not gain the desired performance advantages. Even if the chips can be assembled on an MCM and then tested at speed, removal and replacement of embedded chips exacerbates the difficulties of fault isolation, adds significant cost and yield risk to the module, and incurs the need for sophisticated tracking and handling capabilities. Furthermore, the reworked part cannot, in general, be of equal quality to the virgin part.

Even if chips can be satisfactorily pre-tested at speed, chip burn-in losses hinder the ability to manufacture MCMs with reasonable yields. Burn-in losses can be as high as 5% per chip for complex logic chips (e.g., state-of-the-art microprocessors), and are seldom much less than 1% per chip. For example, a 20-chip module in which all the chips have a 5% burn-in failure probability has only a 36% probability of surviving burn-in.

One proposed solution to burn-in losses is to use tape-automated bonding (TAB) technology to burn in the chips on tape prior to module assembly. The tape, however, can warp during extended high-temperature (125°–150° C.) operation, due to different stress relaxation processes in the various metal, adhesive, and polyamide layers of the tape/chip combination. This approach therefore does not satisfy many of the desired burn-in test apparatus criteria.

Manufacturers of MCMs therefore need a reliable method and device for testing individual ICs and conducting burn-in tests prior to assembling the chips onto an MCM. In particular, to minimize handling damage and cost of fixturing, the method and device can ideally be implemented on a wafer scale. In this manner, manufacturers could use a single, instead of multiple, fixturing device.

SUMMARY OF THE INVENTION

The present invention provides a burn-in test assembly and method which permits burn-in tests to be conducted at speed on bare chips.

According to one embodiment of the present invention, a high density interconnect substrate (HDI) is configured as a test substrate for the burn-in tests. The unpackaged ICs to be tested may be located as part of an unsawed device wafer. At those physical locations where an IC device pad is located, a deformable, electrically conductive bump, for example, solder, exists on the surface of the HDI. The device wafer is aligned with the test substrate and placed against the solder bumps. Electrical contact to the test substrate is thus made through the solder bumps. Because the bumps are deformable and not rigid, contact will be made to all bumps including the lowest, once a force to hold the wafer against the bumps is applied. Burn-in tests can then be performed at the desired operating speeds. Once the test is completed, the wafer is removed and sawed into IC chips also known as dice or die. Those chips failing the burn-in procedure are discarded. The solder bumps are then reflowed to restore their original shape and a new device wafer can be tested.

According to another embodiment of the present invention, the heat transfer from the device wafer/test substrate assembly can be actively controlled to provide the desired burn-in temperature. The burn-in oven required in typical burn-in tests therefore can be eliminated.

The present invention thus eliminates the need to conduct burn-in tests on an assembled multichip module. The test substrate of the present invention may also be reused many times thereby reducing test costs. In addition, the die tested by the present invention need not undergo potentially damaging wirebonding, removal and other handling since the die merely rests on the solder bumps. Reductions in test assembly volume and the ability to actively thermally manage the test assembly lead to reductions in the size of burn-in ovens or alternatively to complete elimination of the burn-in oven, thereby providing additional benefits in power consumption, equipment and facilities.

DESCRIPTION OF THE PREFERRED EMBODIMENT

Figure 1:
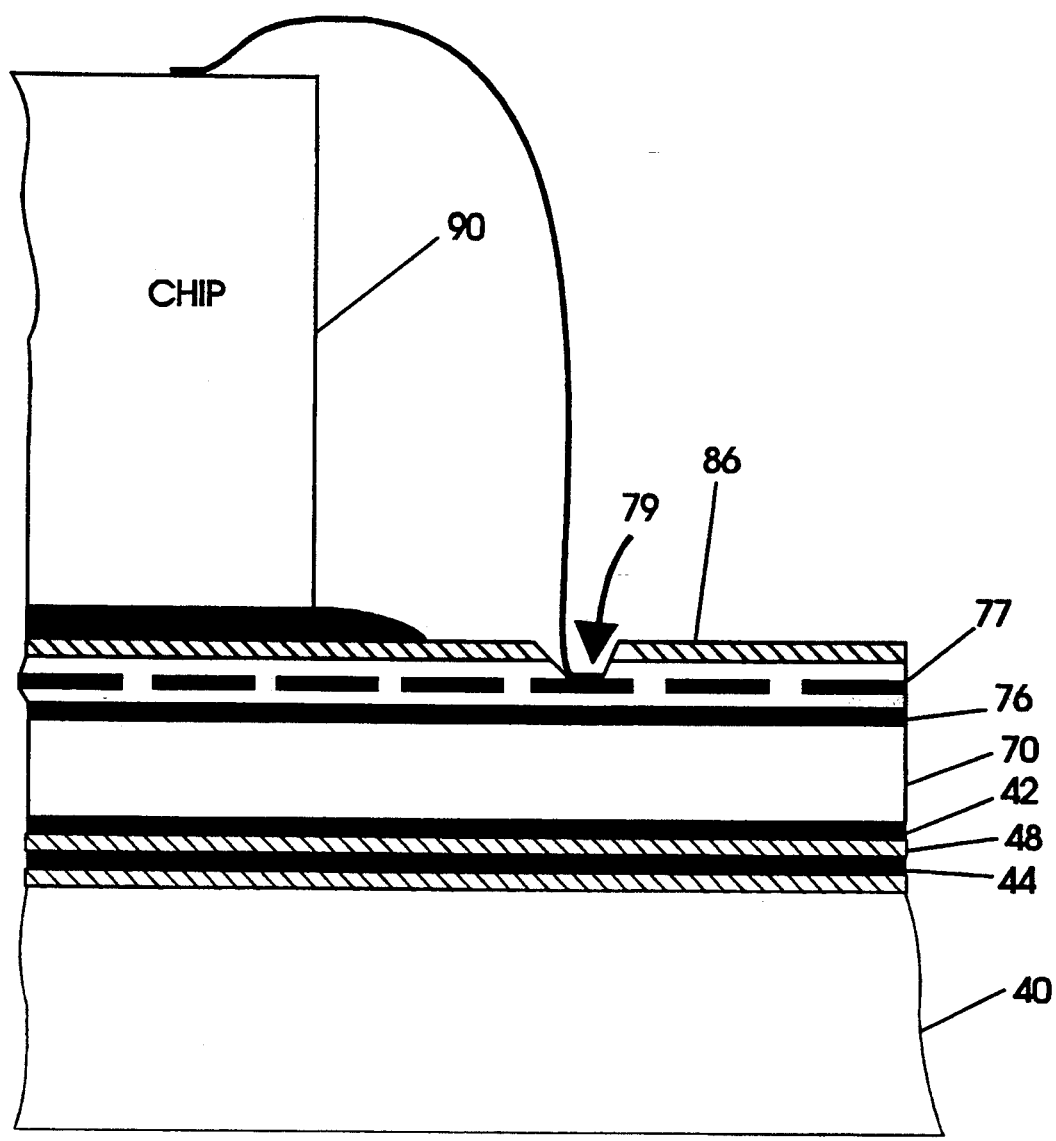
FIG. 1 is a cross-sectional view of a typical multichip module.
Figure 2:
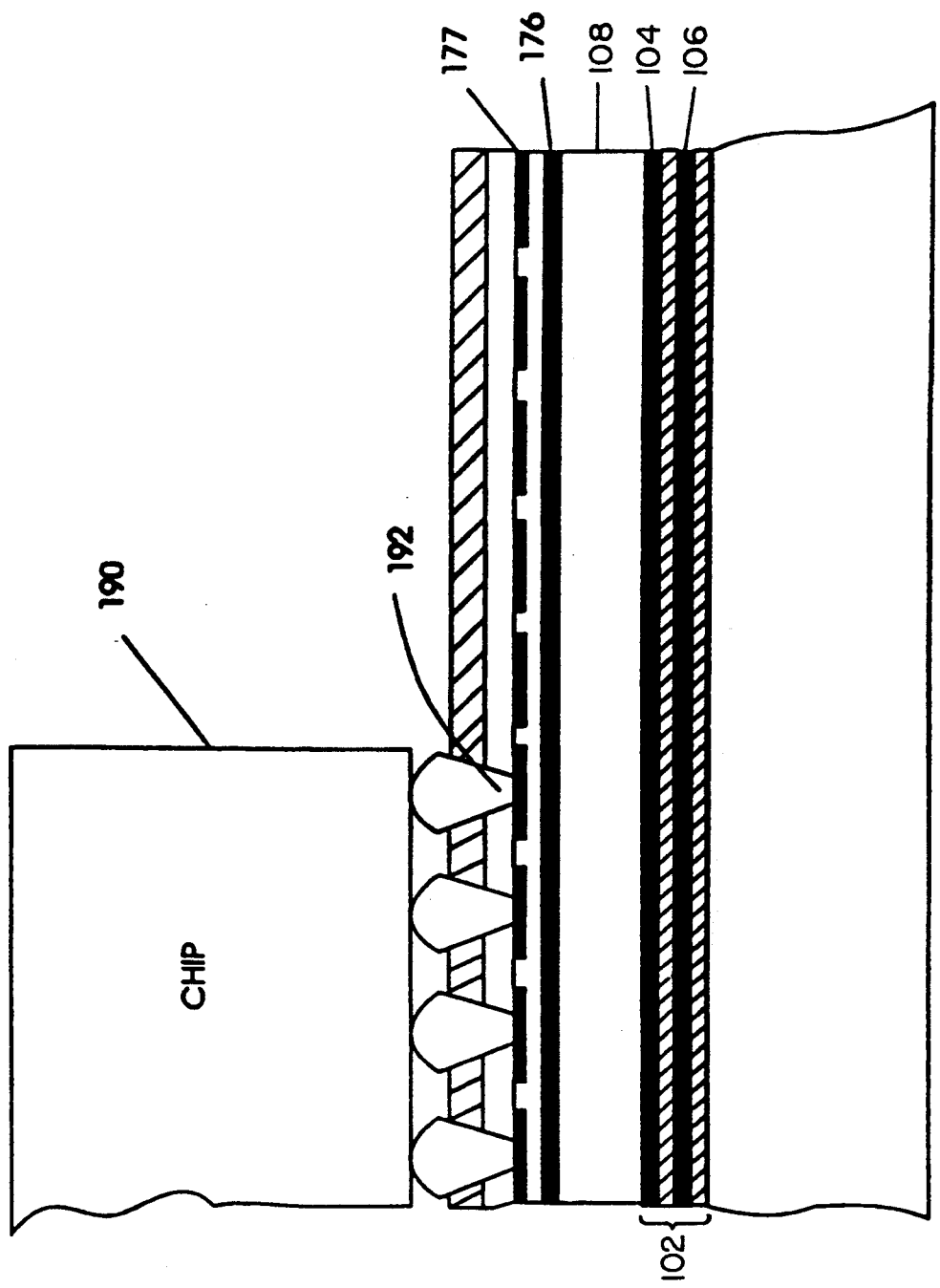
FIG. 2 is a cross-sectional view of a test substrate according to an embodiment of the present invention.

FIG. 2 is a cross-sectional diagram of a test substrate 100 having an HDI similar to that of the multichip module of FIG. 1. The HDI of FIG. 2 has a conducting plane 102 including power and ground planes 104 and 106, insulating layer 108 and layers of interconnect 177 and 176 for electrically contacting an integrated circuit 190. In the structure of FIG. 2, a hemispherical "soft dot", or bump 192 of electrically conductive material such as solder has been placed, for example on the surface of metal interconnect layer 177 at the locations where electrical contact is made between layer 177 and 190. The bumps 192 and conductors 177 are positioned on the substrate to align with the bonding pads of the IC's when the IC's are inverted. The chip is inverted and the IC bonding pads contact solder dots 192. IC 190 is merely held against the solder dots 192 with enough force to assure electrical contact and no permanent connection between solder dots 192 and IC 190 is formed. ICs 190 may be individually placed on the burn-in substrate or the ICs may be integral to an unsawed wafer.

With IC 190 pressed against dots 192, the burn-in tests can be performed. Once these tests are completed, integrated circuit 190 is removed and dots 192 are reworked (reflowed) to allow a second integrated circuit 190, or second wafer, to undergo burn-in tests. This process can be repeated several times before failure of the burn-in test assembly. Devices which satisfactorily complete the burn-in test can be assembled onto HDIs to form MCMs.

Test Apparatus

Figure 3:
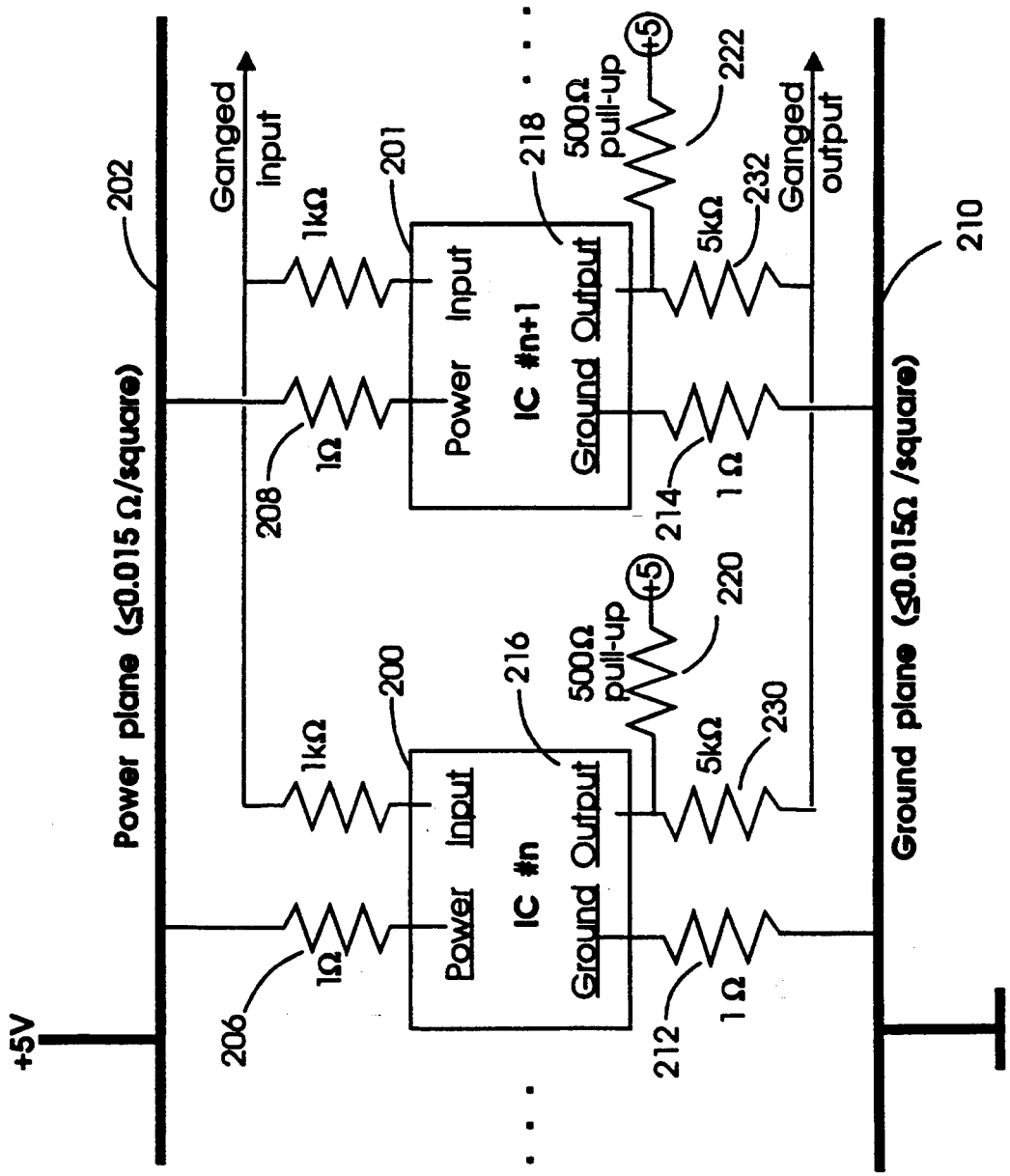
FIG. 3 is a schematic diagram of a burn-in test substrate according to an embodiment of the present invention.

FIG. 3 is a schematic diagram of a burn-in substrate which connects ICs 200 and 201 in parallel so that each chip can be simultaneously and dynamically burned in while power, clock and test vectors are being exercised. In the circuit of FIG. 3, each integrated circuit 200 and 201 is coupled to power plane 202 of the test substrate through isolation resistors 206 and 208, respectively. Similarly, each integrated circuit 200 and 201 is coupled to ground plane 210 of the burn-in substrate through isolation resistors 212 and 214. Isolation resistors 206, 208, 212, and 214 prevent a short in a single test chip from shorting out the entire test circuit.

The output terminals of chips 200 and 201 should be properly loaded, for example with pull-up resistors 220 and 222, to prevent possible unwanted oscillations, without interfering with the test and operation of the remaining chips on the burn-in substrate. The reference voltage to which the pull-up resistor 220 and 222 are coupled may be supplied through an additional power plane or through a metal interconnection of the burn-in substrate.

Of course, not all chips may be functional during testing. Some chips may have faults and thus may have internal short circuits resulting from latch-up or fabrication defects which cause high current drain on specific bond pads. In the circuit of FIG. 3, these potential problems are addressed by inserting isolation resistors 230–232 in series with each integrated circuit output pad before ganging the pads together. Resistors 220–222 and 230–232 may be formed as thin film resistors integral with the burn-in substrate as described in U.S. patent application Ser. No. 07/629,746.

The type of circuit family and the nature of the pad determine what value of resistor is appropriate. For example, a resistance of ~1 kΩ per pad isolates input terminals of ganged chips from each other, without consuming excess power or impairing the ability to apply high-frequency test vectors to the chips. Output pads may be wired together with 5 kΩ isolating resistors, so that the mean output level can be sensed at the periphery of the burn-in substrate, yet the isolating resistors are sufficiently high that this mean level does not act as an undesired pull-up or pull-down on individual output terminals. In addition, each output terminal can have its own personal pull-up or pull-down resistor to a power or ground rail, as required by the logic family. In a typical application, this resistor might be 500 or 1000 Ω. For pads which can act as either inputs or outputs (e.g., tri-state drivers used in bus structures), the circuitry is analyzed to determine the optimal resistor value. A potential inability to clock the chips at their maximum speed due to RC delays resulting from the use of isolation resistors is not likely to be important since dynamic burn-in is normally performed at a very nominal clock speed (for example, 1 MHz).

In contrast to the input and output pads, the power supply pads require a very low value of isolation resistance, on the order of 1 Ω per pad, to avoid excess voltage drop. Limiting voltage drops can be particularly critical for devices which draw DC current, for example, ECL technology. In order to provide a uniform voltage across the wafer, the effective resistance of the power distribution system (power and ground planes) should be substantially lower than the resistance of the isolation resistors. The magnitude of the voltage drop on the power feeds which can be tolerated during burn-in is greater than what would be tolerable in an actual system application. This difference is because, for burn-in, the only interest is in exercising the chips, and overall system noise margins are not a concern. However, if desired, the overall power supply voltage may be increased slightly to compensate for voltage drops in the isolation resistors 206–214, thereby ensuring that all chips receive a minimum specified burn-in voltage.

Isolation resistors are chosen so a dead short can be accommodated without disrupting the rest of the IC's and without burn-ing out the isolation resistor. Burning out the isolation resistor would make the test substrate nonreusable. The approach in which chips are ganged together in parallel, with isolation resistors on all the pins, also suffers from a potential problem if the die yield is low. For example, if the die yield is only 10%, then most of the chips on the wafer are nonfunctional. The nonfunctional chips could create a massive drain on the power supply (if short-circuited) and also make it impossible to evaluate whether the good chips are behaving correctly (since the output pins will be the mean of all the output levels, and if 90% of these output levels are incorrect then the result will be noise). Low-yielding wafers can be subjected to a selective laser ablation process (in which the bond pads are vaporized with a short-wavelength excimer laser, exposing the underlying glass) so that these chips do not get powered up (nor do any of the bond pads get connected) when mated to the burn-in test substrate. Alternatively, a coining tool can be used to coin those bumps necessary to disable chip operation. For example, a solder bump which provides contact to power or ground may be coined such that the bump height is sufficiently lower than the height of the other bumps such that the wafer does not contact the coined bump.

Possible routing difficulties in parallel ganging of the chips on the burn-in substrate may be avoided by providing multiple layers of interconnect on the burn-in substrate. Similarly, multiple power and ground planes may be used to increase the amount of current which can be supplied to the test wafer. Multiple power and ground planes may prove particularly useful in testing of emitter coupled logic (ECL) and gallium arsenic (GaAs) circuits having device wafer power consumptions in excess of 1kW or multiple power supply voltage levels.

External electrical connections to the burn-in substrate supply test signals and power to pins or pads surrounding the burn-in substrate. The burn-in substrate thus is preferably physically larger than the device wafer. Various connectors, including a gold dot or fuzz button type connector mated to a high temperature flex circuit, or a "pogo" connector mated to a ceramic interface board can be used to connect to the burn-in substrate. Ideally, the connector chosen can tolerate high temperatures without welding to or contaminating the contact pads.

Figure 4:
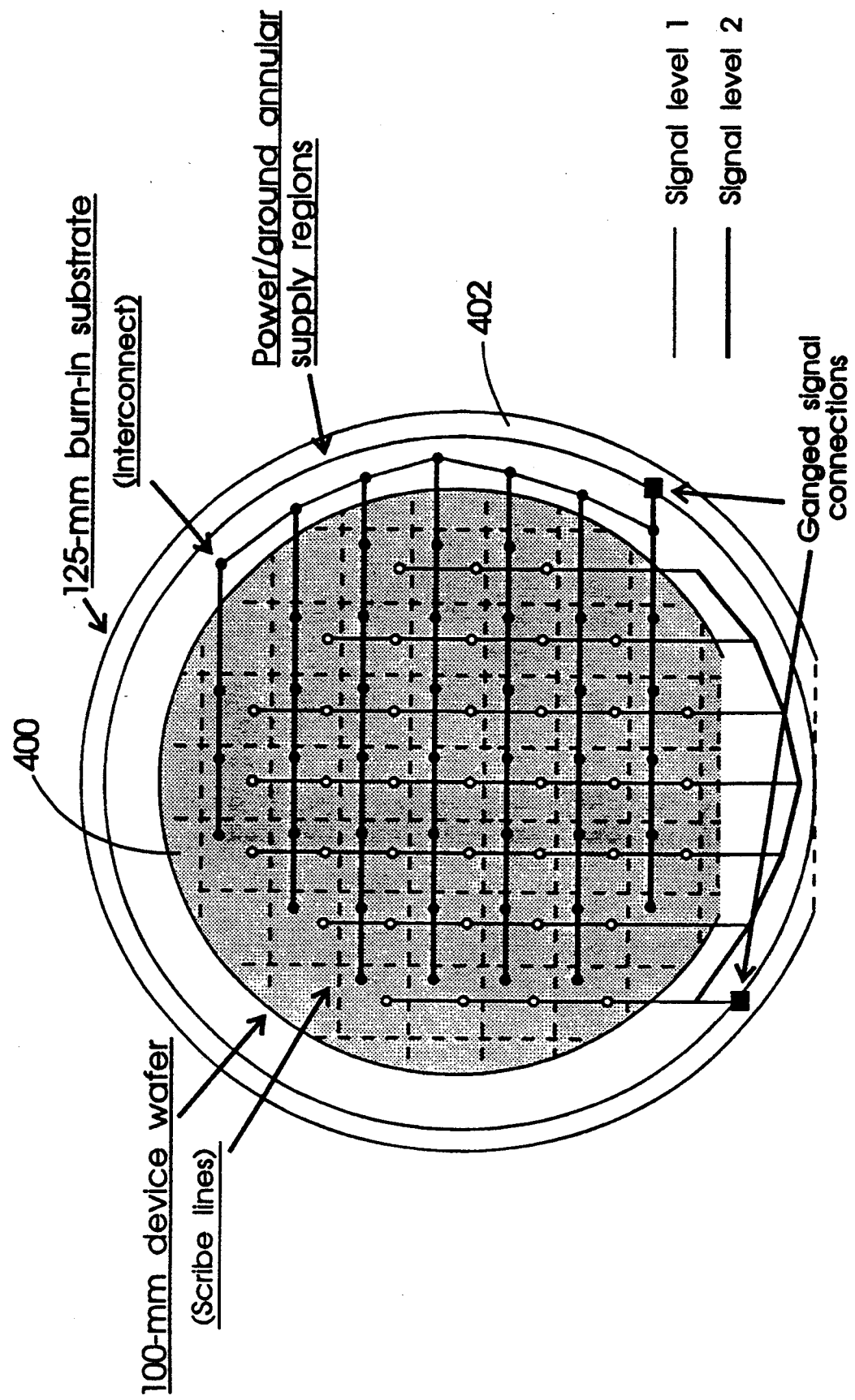
FIG. 4 is a top view of a device test wafer connected to a burn-in test substrate according to an embodiment of the present invention.

FIG. 4 is a top view of a test wafer 400 connected to burn-in substrate 402. The structure shown includes substrate 402 illustrating the ganged signal connections for two signal levels. Not seen in the top view diagram of FIG. 4 are the power and ground planes which lie underneath the signal level. Annular regions on the periphery of the substrate provide desired potential supplies, typically power and ground to appropriate connections traversing the substrate. As described above, the wafer is face to face against the burn-in substrate so bonding pads on each chip contact the substrate at desired locations to receive input signals, detect output signals, and supply necessary power levels.

Dot Fabrication Techniques

A variety of techniques can be used to form the solder dots on the contact pads of the burn-in substrate. (Alternatively, the solder dots may be formed on the contact pads of the IC.) One known technique for forming solder dots is electroplating through a photoresist mask. Another technique involves gold "ball bumping" followed by solder dipping. A third is directly forming the solder ball by ball bumping of solder wire. Gold ball bumping techniques are described in Kulicke and Soffa Industries, Willow Grove, Pa. wire bonder product literature, and in U.S. Pat. No. 4,717,066 to Goldenberg, et al. Palladium-doped gold wire is used in a conventional wire bonder (ball bonder). Wire from Hydrostatics, Inc. of Bethlehem, Pa. (98%+Au—Pd, 0.001" diameter, 1–3% elongation, 26.5–27.0 gm break strength) is also suitable for forming the solder bumps. A Kulicke and Soffa 1419 wire bonder with "Dawn G. 1" software has been found satisfactory for use with the Hydrostatics wire in the present invention to form the contact bumps.

Figure 5A:
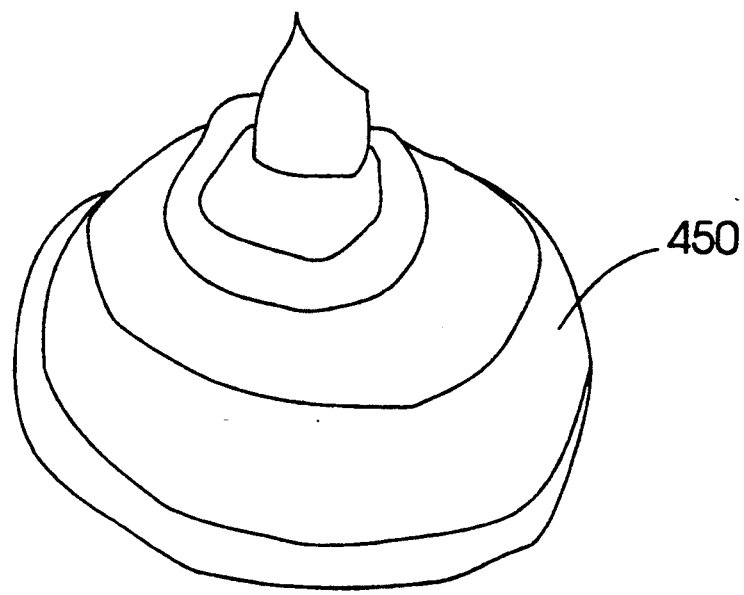
FIG. 5A is a view of a gold ball formed according to an embodiment of the present invention.
Figure 5B:
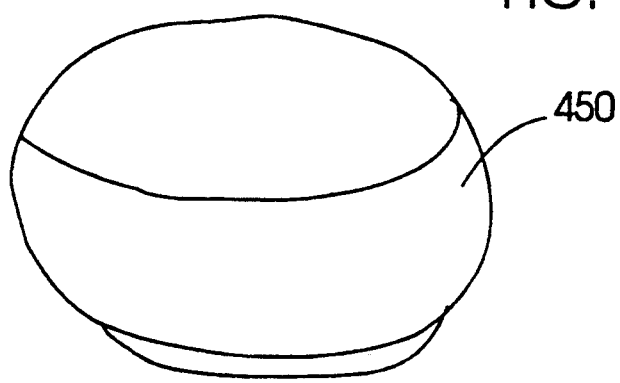
FIG. 5B is a view of a gold ball coined to form a planar surface according to an embodiment of the present invention.

Using the equipment and wire described, the presence of the palladium in the gold wire results in a brittle intermetallic at the neck of the ball bond, such that the wire "automatically" severs at the neck in the course of normal bonding. This yields gold balls 450 having the appearance shown in FIG. 5A. Bump 450 is then "coined" with a special tool, such as used in tape automated bonding, to produce a planar surface as seen in FIG. 5B for solder dipping. The ball may be coined with a 6-mil square tool from Gaiser Tool Company, Ventura, Calif., resbiting in a height distribution ranging from 35 to 37 μm (standard deviation=0.5 μm) as measured with a high-power optical measuring microscope. Balls made with this process had a 70 gm average shear strength after 24-hour storage at 150° C. The resultant ball diameter is approximately 2.5-2.75 mil, and has been proven useable with ICs having a pad pitch as small as 6 mil.

The gold balls are preferably coated with approximately 0.5 mil of electroless nickel prior to solder dipping, to reduce intermetallic formation. The coating reduces the tendency to form brittle intermetallics during subsequent flow and also enables the use of soft solder such as Pb—Sn.

Figure 5C:
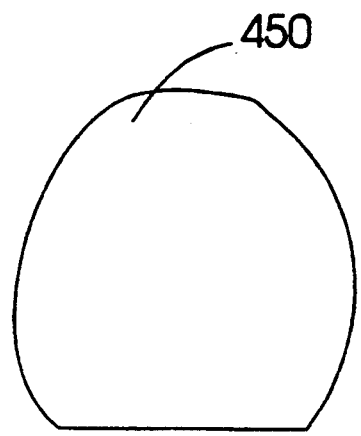
FIG. 5C is a view of a gold ball dipped in solder according to an embodiment of the present invention.

After formation of the gold bumps and nickel plating, the substrate is fluxed with an "R" type (nonactivated) rosin, and manually dipped for 5 seconds in a 325° C. static solder pot (Marshall Industries) of 75-25 (wt.) lead-indium solder supplied by Indium Corporation of America. The Pb—In alloy minimizes gold leaching and enhances wettability of the gold balls when a nickel barrier is not used. Also, the Pb—In is believed less prone to oxidation than other alloys. A layer of tinning oil on the surface of the solder pot may be used to minimize solder oxidation. FIG. 5C shows the ball after solder dipping.

Mating of the Wafer/Chip to the Burn-In Substrate

Wafers and their associated ICs, or the individual chips themselves, are not fixedly mounted to the solder bumps, but are held against the solder bumps by applying an external force. Several techniques may be used to hold the electrically active surface of the wafer/die structure against the contact bumps with sufficient force to ensure excellent electrical contact. The exact amount of pressure required will vary with the type of material used to fabricate the bumps and with the coplanarity of the bumps. An average force of 30 grams per dot typically is sufficient to provide the desired contact.

Figure 6A:
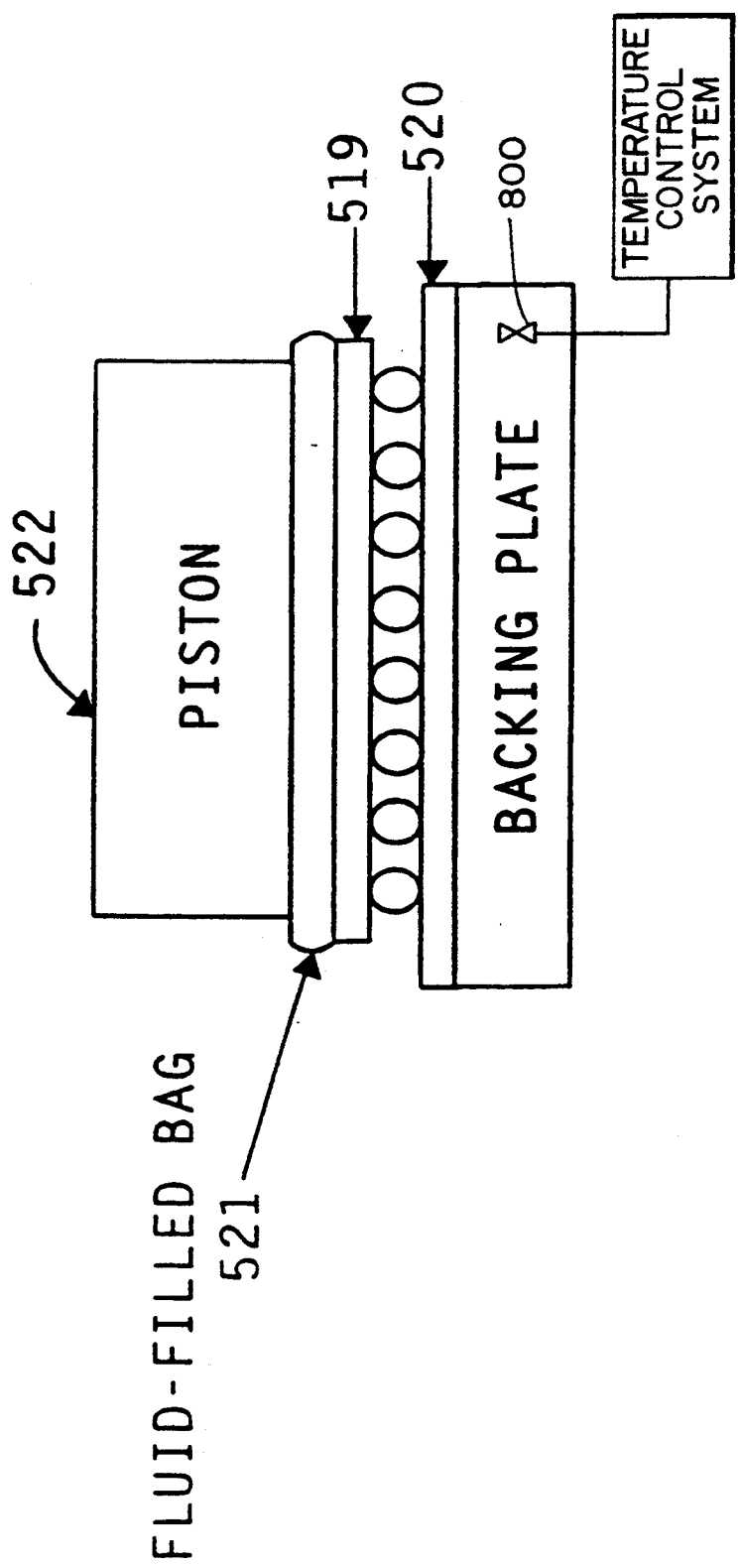
FIG. 6A is a side view of a test wafer held in position on a burn-in test substrate by a pneumatic piston according to an embodiment of the present invention.

One method for holding the die against the bumps is the use of a hydraulic or pneumatic piston as seen in FIG. 6. A liquid filled bag made of high strength plastic may be inserted between the piston and the wafer assembly to provide a uniform hydrostatic pressure loading on the device wafer. The liquid filled bag avoids problems of nonuniform loading caused by tilt of the chip or wafer with respect to the piston or the substrate. In FIG. 6A, the test wafer 519 is positioned on substrate 520. Fluid filled bag 521 is located between wafer 519 and piston 522.

Figure 6B:
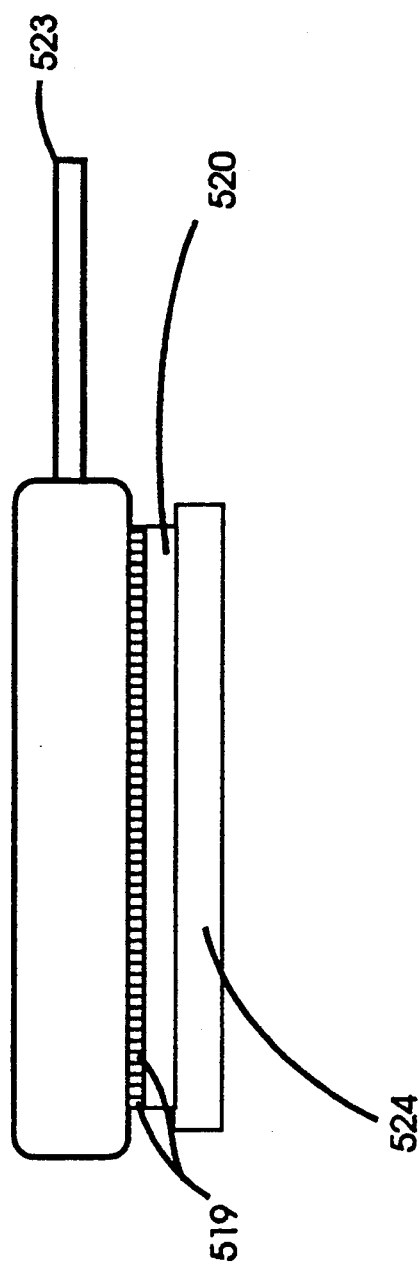
FIG. 6B is a side view of a test wafer held in position on a burn-in test substrate by an inflatable bladder according to an embodiment of the present invention.

Alternatively, an inflatable bladder as shown in FIG. 6B and described in U.S. Pat. No. 4,968,931 to Littlebury et al. may be used. Preferably, the bladder is liquid filled for improved safety. In FIG. 6B the test wafer 519 is positioned on substrate 520 and held in place by bladder 523. A heat sink 524 may be attached to substrate 521.

Figure 7:
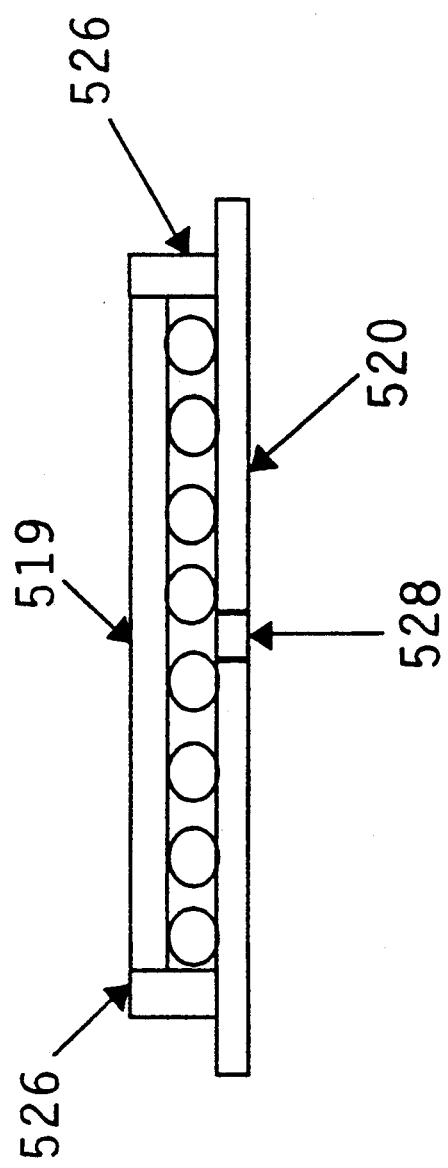
FIG. 7 is a cross-sectional view of a test wafer held in position on a burn-in test substrate by applying a vacuum pressure according to an embodiment of the present invention.

If the required contact pressure to secure test wafer 519 is less than 12 pounds per square inch (83 kPa), atmospheric pressure may be used by creating a vacuum between the device wafer and the electrically active surface of the burn-in substrate as shown in FIG. 7. To create the vacuum, a temporary seal is first fashioned between the edge of the device wafer 519 and the burn-in substrate 520 using an elastomer material 526. With the seal in place, the resulting interior cavity is evacuated through an opening 528 in the substrate, for example, as drilled by a laser. The magnitude of the force exerted on the device wafer also can be controlled by creating a partial vacuum. The vacuum approach requires less fixturing and thus permits more test wafer/burn-in substrate combinations to fit inside the burn-in oven than if an external bladder or piston is used.

Because the solder bumps deform under the contact loading, sufficient mechanical and electrical contact is made to all the solder bumps including the lowest upon application of sufficient contact loading. Furthermore, deformation of the solder balls under this loading may cause the thin oxide coating on the solder balls to crack. This cracked coating is somewhat brittle and serves as an abrasive to scrub away any oxide coating on the chip contact pad. This scrubbing action thereby improves electrical contact between the chip and the test substrate. Optionally, the solder balls may be loaded with an abrasive material such as tungsten powder. This abrasive material then scrubs away the oxide layer on the chip contact pad upon application of the contact loading.

Several techniques can be used to align the device wafer with the burn-in substrate. Infrared alignment may be used, however, this technique requires polishing the back side of the device to be contacted (i.e., the wafer or the IC) to make it transparent to infrared light. Alignment by X-ray examination may also be used. Normally, the wafer or chip is transparent to the X-ray. The solder bumps, however, are visible (absorbing X-rays) under X-ray illumination. To align the wafer with the test substrate, therefore, one or more gold solder bumps are placed on the surface of the wafer or chip. The bump(s) on the wafer or chip are then positioned so as to line up with similar bumps on the surface of the substrate. Optionally, pit(s) (laser drilled) may be drilled into the surface of substrate and the alignment bump(s) can protrude to mate with the pits.

Thermal Management

With the burn-in technology of the present invention, the burn-in oven itself may be eliminated through proper thermal management and active control loops. This active control of junction temperature is seldom achieved in burn-in of conventionally packaged ICs.

For low-power chips (less than 100 watts/wafer), the wafer's self-heating typically is inadequate to bring the assembly up to the desired temperature. The burn-in substrate may be mounted on a heat spreader such as a copper plate as shown in FIG. 6A. The burn-in substrate and burn-in wafer are thus thermally clamped together due to the thermal conduction path provided by the bumps. To provide the necessary heat, a small heater can be attached to or integrated in the copper plate to elevate the temperature. The heat spreader is instrumented with thermocouples 800 to verify operating temperature. Controlling the temperature to the desired level is accomplished by techniques well known to those of skill in the art.

In the medium-power case (100-1000 watts/wafer), the wafer's self-heating is such that the assembly would exceed the desired temperature without any external heat source. Thus, cooling must be provided. Air may be blown over the wafer using a variable-speed fan which is controlled by the thermocouple output. Alternatively, the copper block may be liquid cooled. In this situation it may be necessary to instrument the back of the wafer, because there can be a significant temperature differential between the wafer and the burn-in substrate.

In the high power case (typically $\geq 1$ kw/wafer), the wafer's self-heating is so high that even the solder bumps cannot transfer heat away fast enough. In this case, significant temperature gradients can build up in the horizontal plane of the wafer, that is, hot spots can form in the center of each chip when only perimeter bond pads are used. This problem will be most severe for ECL or GaAs devices which dissipate relatively high power (~20 W/cm$^2$) into a material having relatively poor thermal conductivity. To remove this heat, a liquid-cooled cold plate is pressed against the back of the wafer to obtain a spatially uniform heat-transfer coefficient of 0.5 W/cm$^2$–° C. or greater from the wafer to the cold plate. Commercially available cold plates and a thermal interface medium such as a conventional heat-sink paste may be used. The cooling fluid, for example, silicone oil or water, is recirculated through a radiator to dissipate the waste heat. A control system determines how much of the fluid should bypass the radiator to maintain the desired fluid temperature. The control system is analogous to a thermostat in an automobile engine cooling system.

Rework of Deformable Bumps

After testing a series of wafers, the deformable bumps may have deformed to the point where sufficient contact between the chips and the test substrate does not occur. At this point, it is possible to reflow the bumps to restore their original shape. The bumps may be reflowed by heating the material past the melting point in a nonoxidizing environment. Reflowing can be accomplished with a hot plate and using flux to prevent oxidation; dipping the substrate in a bath of hot oil; reflowing in a reducing atmosphere of forming gas preventing oxidation; or by using a laser to directly heat the material. To enable reflow without damaging the substrate, the deformable bump material should have a melting point less than the maximum temperature limit of the substrate. This limit value is typically 400° C. Conversely, the melting point must be higher than the burn-in temperatures (typically 125° C. or 150° C.) to prevent reflow or excessive deformation of the bumps during the burn-in process.

The bumps may also be reworked by reconstituting the bumps. The test substrate is dipped in a pot of molten solder and then withdrawn. Solder dipping has been described above under the heading Dot Fabrication Techniques. Reworking the solder bumps by solder dipping is likely to work best if the solder bumps were originally formed by solder dipping.

The ability to reflow the bumps after several test cycles allows the test device of the present invention to be employed many times. The cost of the test substrate is thus amortized over many uses and thereby significantly reduces test costs. In addition, rework capability of the deformable bumps may be employed advantageously in assembly of MCMs using adhesive flip chip processes (as described in U.S. Pat. No. 4,749,120 to Hatada). In the present invention a chip which is improperly attached or which later proves defective, may be removed and the solder dot reflowed. The chip may then be reattached or a new chip attached to complete the MCM assembly. The rework capability and the present invention can therefore also reduce the cost of assembling MCMs.

Table 1 lists many of the advantages of the invention as described above. Preferred embodiments of the present invention have now been described. Variations and modifications will be readily apparent to those of skill in the art. For this reason, the invention should be considered in light of the claims.

TABLE 1

Tolerant of continual operation at junction temperatures 125° C.–150° C. or higher.

Suitable for wafer-scale use. The cost, complexity, and risk of damage associated with handling, aligning and fixturing large numbers of individual die is formidable. Wafer-scale burn-in avoids these difficulties, allowing the use of simple fixtures, and potentially large cost savings. Wafer-scale burn-in as described here includes capability of independently powering discrete chips.

Area array capability. While the vast majority of contemporary IC's use only a single row of perimeter I/O pads, multiple rows or full area array IC's can also be tested.

Fine-pitch capability. While present commercial applications seldom go below 100 μm pitch, the invention allows testing 50 μm pitches or smaller which will be in production by the end of the decade.

Reusability of the burn-in substrate.

Low cost.

Acceptable to the IC manufacturers. Because many manufacturers are reluctant to sell wafers (for reasons of yield data and test structure confidentiality), the burn-in capability can be a part of the IC manufacturer's process.

Tolerant of essentially uncontrolled atmospheres. For both economic and logistical reasons, it is desirable to avoid inert atmospheres for burn-in.

Zero pad contamination. The subsequent bondability of the I/O pads is not impaired.

Predictable heat transfer characteristics.

Modest compressive force requirements. Achieving good contact with a pressure of ≦12 psi is of particular value, because it makes possible the use of atmospheric pressure as the source of the compressive force.

What is claimed is:

1. A test apparatus for testing at least one integrated circuit having contact pads, the apparatus comprising:
   a test substrate including:
   (i) a base;
   (ii) a conducting plane on top of said base;
   (iii) an interconnect layer;
   (iv) an insulating layer disposed between the interconnect layer and said conducting plane;
   means for coupling the test substrate to a source of test signals;
   a plurality of electrically conductive non-rigid deformable bumps disposed between the interconnect layer of said test substrate and individual contact pads of the at least one integrated circuit to provide electrical contact between the test substrate and the at least one integrated circuit; and
   wherein at least one of said deformable bumps experiences permanent deformation when contacted by said at least one integrated circuit.

2. The test apparatus of claim 1 wherein each of said electrically conductive deformable bumps comprises lead-indium solder.

3. The test apparatus of claim 1 wherein each of said electrically conductive deformable bumps is attached to the interconnect layer of said test substrate.

4. The test apparatus of claim 1 wherein each of said electrically conductive deformable bumps has a melting point less than a maximum temperature at which said test substrate retains functionality.

5. The test apparatus of claim 1 wherein each of said electrically conductive deformable bumps has a melting point temperature greater than a test operating temperature.

6. The test apparatus of claim 1 wherein the at least one integrated circuit comprises a plurality of integrated circuits on a wafer.

7. The test apparatus of claim 1 wherein said electrically conductive deformable bumps comprise reworkable electrically conductive deformable bumps.

8. The test apparatus of claim 1 further comprising a means for holding said integrated circuit in contact with said deformable bumps.

9. The test apparatus of claim 8 wherein said means for holding said integrated circuit in contact with said deformable bumps comprises a piston.

10. The test apparatus of claim 8 wherein said means for holding said integrated circuit in contact with said deformable bumps comprises a fluid-filled bladder.

11. The test apparatus of claim 8 wherein said means for holding said integrated circuit in contact with said deformable bumps comprises a means for forming a vacuum between a surface of said test substrate and a surface of said integrated circuit.

12. The test apparatus of claim 1 further comprising a means for regulating the temperature of said integrated circuit.

13. The test apparatus of claim 1 further comprising a temperature regulator including:
    (i) a heat sink attached to said substrate;
    (ii) a temperature measuring device mounted on said heat sink; and
    (iii) a control system coupled to said temperature measuring device and to said heat sink for regulating the temperature of said integrated circuit.

14. The test apparatus of claim 1 wherein said electrically conductive deformable bumps comprise lead-tin solder.

15. The test apparatus of claim 1 wherein a given one of said plurality of electrically conductive deformable bumps is coined to prevent said given bump from contacting said contact pad.

16. The test apparatus of claim 1, wherein said plurality of deformable bumps comprise reflowed deformable bumps.

17. A method for testing an integrated circuit comprising the steps of:
    forming a plurality of non-rigid, deformable, electrically conductive bumps on an interconnect layer of a test substrate;
    placing contact pads of the integrated circuit in removable contact with said non-rigid deformable electrically conductive bumps and causing at least one of said non-rigid deformable electrically conductive bumps to experience permanent deformation; and
    supplying a plurality of test signals to said test substrate to exercise said integrated circuit.

18. The method of claim 17 wherein the step of placing said contact pad in removable contact with said bumps comprises the step of:
    creating a vacuum between a top surface of said substrate and a surface of said integrated circuit adjacent said top surface of said substrate.

19. The method of claim 17 wherein the step of placing said contact pad in removable contact with said bumps comprises the step of:
    applying pressure, to a top surface of a device wafer containing said integrated circuit therein, with a piston.

20. The method of claim 17 wherein the step of placing said contact pad in removable contact with said bumps comprises the step of:
    applying pressure, to a top surface of a device wafer containing said integrated circuit therein, with a fluid filled bladder.

21. The method of claim 17 further comprising the step of actively controlling a temperature of said test substrate and said integrated circuit whereby a burn-in test is conducted without a burn-in oven.

22. The method of claim 17 further comprising the step of:
    reflowing said non-rigid deformable bumps to form new non-rigid deformable bumps.

23. The method of claim 17, wherein the integrated circuit comprises a plurality of integrated circuits on a device wafer and further comprising the step of ablating a selected contact pad using a laser to prevent operation of a given one of said plurality of integrated circuits during testing of said device wafer having said plurality of integrated circuits.

24. A method for burning-in a plurality of integrated circuits comprising the steps of:
    forming a plurality of non-rigid, deformable, electrically conductive bumps on an interconnect layer of a test substrate;
    placing contact pads of a first integrated circuit in removable contact with said non-rigid, deformable electrically conductive bumps and causing at least one of said non-rigid deformable electrically conductive bumps to experience permanent deformation;
    supplying a plurality of test signals to said test substrate to exercise said first integrated circuit;
    reflowing said deformable bumps, after said first integrated circuit has been tested, to form a new non-rigid, deformable, electrically conductive bumps;
    placing a contact pad of a second integrated circuit in contact with said new non-rigid, deformable electrically conductive bumps; and
    supplying test signals to said test substrate to exercise said second integrated circuit.

* * * * *